United States Patent [19]
Brown

[11] Patent Number: 6,025,765
[45] Date of Patent: Feb. 15, 2000

[54] GYRATOR WITH LOOP AMPLIFIERS CONNECTED TO INDUCTIVE ELEMENTS

[75] Inventor: Anthony Kevin Dale Brown, Kanata, Canada

[73] Assignee: Nortel Networks Corporation, Montreal, Canada

[21] Appl. No.: 09/056,711

[22] Filed: Apr. 8, 1998

[51] Int. Cl.[7] .................................................. H03H 11/42
[52] U.S. Cl. ..................... 333/215; 330/254; 331/108 B; 331/135
[58] Field of Search ..................................... 333/213, 214, 333/215; 331/108 B, 135; 330/254; 327/552

[56] References Cited

U.S. PATENT DOCUMENTS

| | | | |
|---|---|---|---|
| 3,618,133 | 11/1971 | Gingell | 333/215 |
| 5,371,475 | 12/1994 | Brown | 330/254 |
| 5,483,195 | 1/1996 | Brown | 330/254 |
| 5,587,689 | 12/1996 | Bowers | 330/254 |
| 5,635,880 | 6/1997 | Brown | 331/108 B |

FOREIGN PATENT DOCUMENTS 0 669 710  8/1995  European Pat. Off. .

OTHER PUBLICATIONS

"An Integrated Low Power Microwave VCO With Sub–Picosecond Phase Jitter", Proceedings of the 1996 Bipolar/BiCMOS Circuits and Technology Meeting, IEEE, Minneapolis, Minnesota, Sep. 29–Oct. 1, 1996.

"Design Considerations in High–Frequency CMOS Transconductance Amplifier Capacitor (TAC) Filters", F. Krummenacher, Proc. of the International Symposium on Circuits and Systems, vol. 1, No. SYMP.22, May 8, 1989, pp. 100–105.

*Primary Examiner*—Robert Pascal
*Assistant Examiner*—Justin P. Bettendorf
*Attorney, Agent, or Firm*—Angela C. de Wilton

[57] ABSTRACT

A gyrator includes shunt or feedback nodal capacitors and shunt lossy inductors without shunt load resistors. The effective nodal capacitance is reduced by the introduction of the shunt lossy inductors. The inductors act to discriminate against injected power supply noise, resulting in improved oscillator phase noise. The inductors produces less drop dc voltage than the resistive load, so that larger linear oscillation is obtained with improved oscillator phase noise.

18 Claims, 13 Drawing Sheets

Angular Frequency

GYRATOR WITH LOOP AMPLIFIERS CONNECTED TO INDUCTIVE ELEMENTS

TECHNICAL FIELD

The present invention relates to a gyrator forming a resonant circuit.

BACKGROUND INFORMATION

In modern communications systems, low phase noise oscillators are required as an integral part of the process of transporting data. While ever increasing data rates are employed, it becomes more and more difficult to meet the requirements for low phase noise. In many applications, the requirement for low phase noise has been met by means of oscillators with fixed frequencies or narrow band tuning range which utilizes some form of a resonant tank circuit of high quality factor (Q). The tank circuit limits the noise bandwidth of the oscillator circuit. In applications where a wider tuning range is needed, it is possible to use a multiple of such oscillators with overlapping tuning ranges. Such arrangements, however, are cumbersome and an alternative class of broad tuning range low noise integrated oscillator is desirable.

U.S. Pat. No. 5,371,475 granted to A. K. D. Brown on Dec. 6, 1994 describes the principles of operation of a class of low noise oscillators, which are known as gyrators. The principles of a conventional gyrator is fully described in the patent. U.S. Pat. No. 5,483,195 granted to A. K. D. Brown on Jan. 9, 1996 describes means of obtaining a broad tuning range for a gyrator oscillator which is independent of process and temperature variations. The prior gyrator needs improvement on achievement of broad tuning range concurrently with low phase noise, for some applications. A paper by A. K. D. Brown entitled "An integrated low power microwave VCO with sub-picosecond phase jitter", IEEE 96CH35966, IEEE BCTM 10.3, pp. 165–168 describes phase noise analysis of gyrators.

SUMMARY OF THE INVENTION

It is an object of the present invention to provide gyrator with an improved phase noise performance.

According to one aspect of the present invention, there is provided a gyrator comprising: a loop having two ports, each port having two terminals, the loop comprising loop-connected first and second amplifiers, each of the first and second amplifiers having a transconductance delay built therein, the gain of the loop being greater than unity, a nodal capacitance appearing between two port's terminals, the capacitance transforming into a nodal inductance in the respective port, the capacitance and inductance forming a resonant circuit for the gyrator oscillation, the nodal capacitance being a factor to the resonant frequency of the gyrator; and a plurality of inductive elements, each inductive element being coupled to the respective terminal of the two ports, thereby varying the nodal capacitance, so that the gyrator oscillates at a frequency which is different from the resonant frequency.

The inductive elements act to discriminate against injected power supply noise, resulting in improved oscillator phase noise. The dc voltage drop of the inductor is less than that of the original resistive load, resulting in larger linear oscillations and reduction in the oscillator phase noise.

BRIEF DESCRIPTION OF THE DRAWINGS

Embodiments of the present invention will now be described by way of example with reference to the accompanying drawings in which.

DETAILED DESCRIPTION

I. Prior Art

Figure 1:
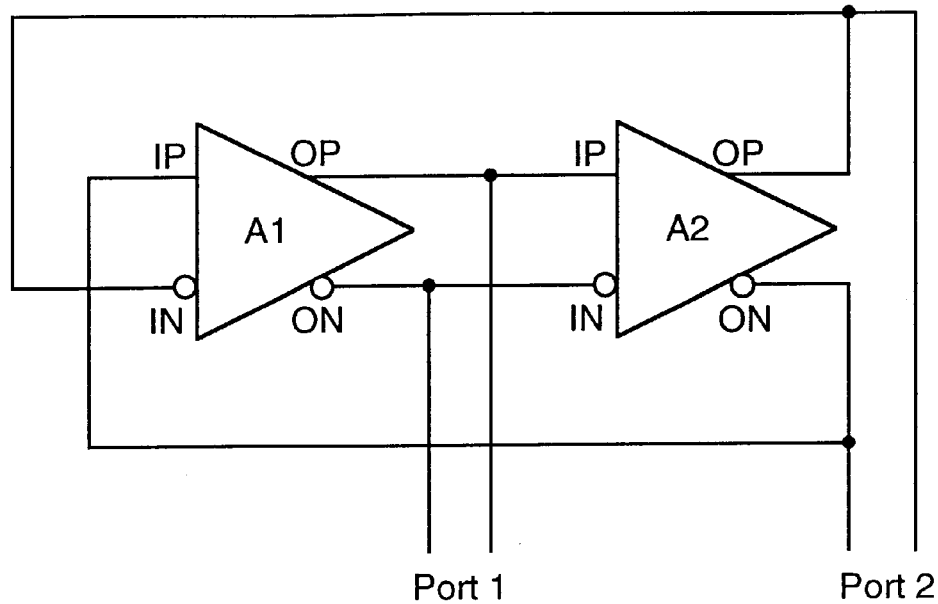
FIG. 1 illustrates a prior art gyrator.

I-1. Gyrator FIG. 1 shows a prior art gyrator including two amplifiers A1 and A2, the gains of which are usually the same. The inverting and non-inverting outputs ON and OP of the amplifier A1 are connected to the inverting and non-inverting inputs IN and IP of the amplifier A2, respectively. The inverting and non-inverting outputs ON and OP of the amplifier A2 are connected to the non-inverting and inverting inputs IP and IN of the amplifier A1, respectively. The amplifiers A1 and A2 are coupled to form a loop, the total gain of which is greater than unity. Operation of the gyrator is described in U.S. Pat. No. 5,483,195, which is incorporated herein by reference.

I-2. Gyrator Model

Figure 2:
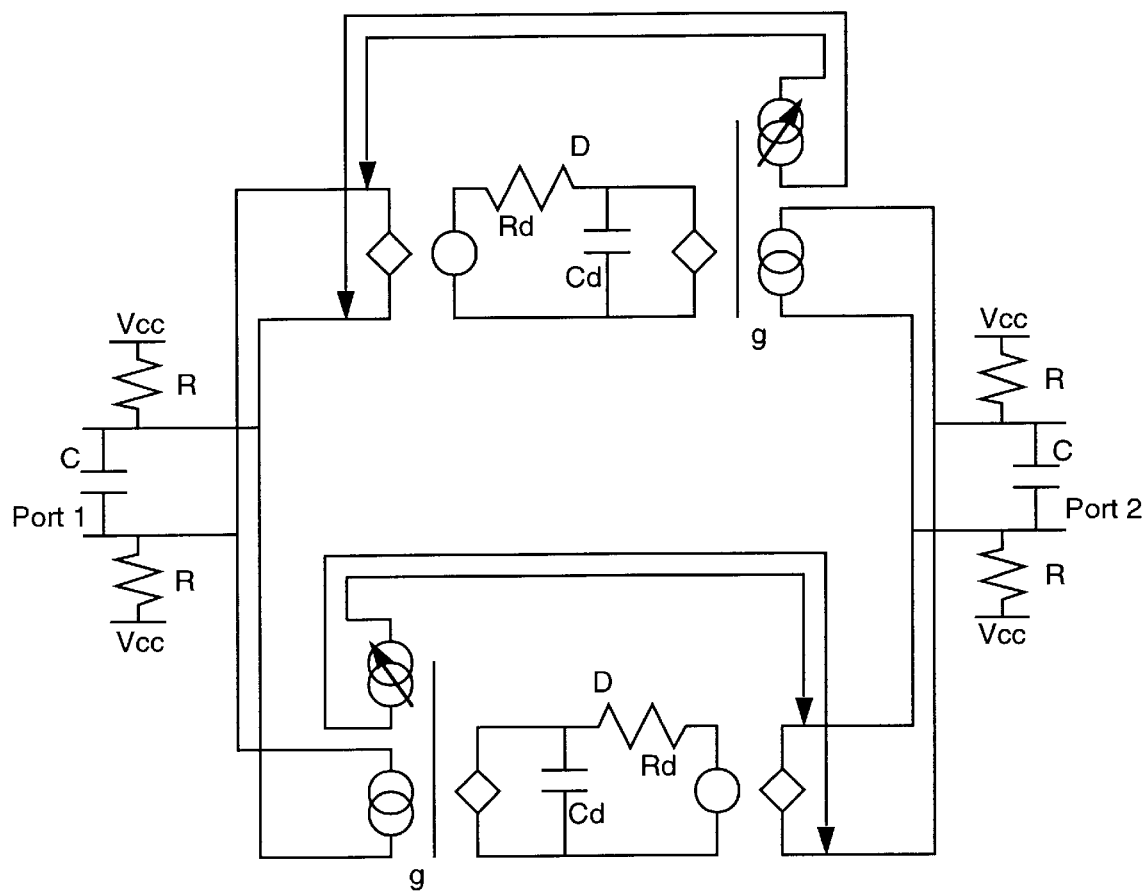
FIG. 2 illustrates a model of a prior art gyrator.
Figure 3:
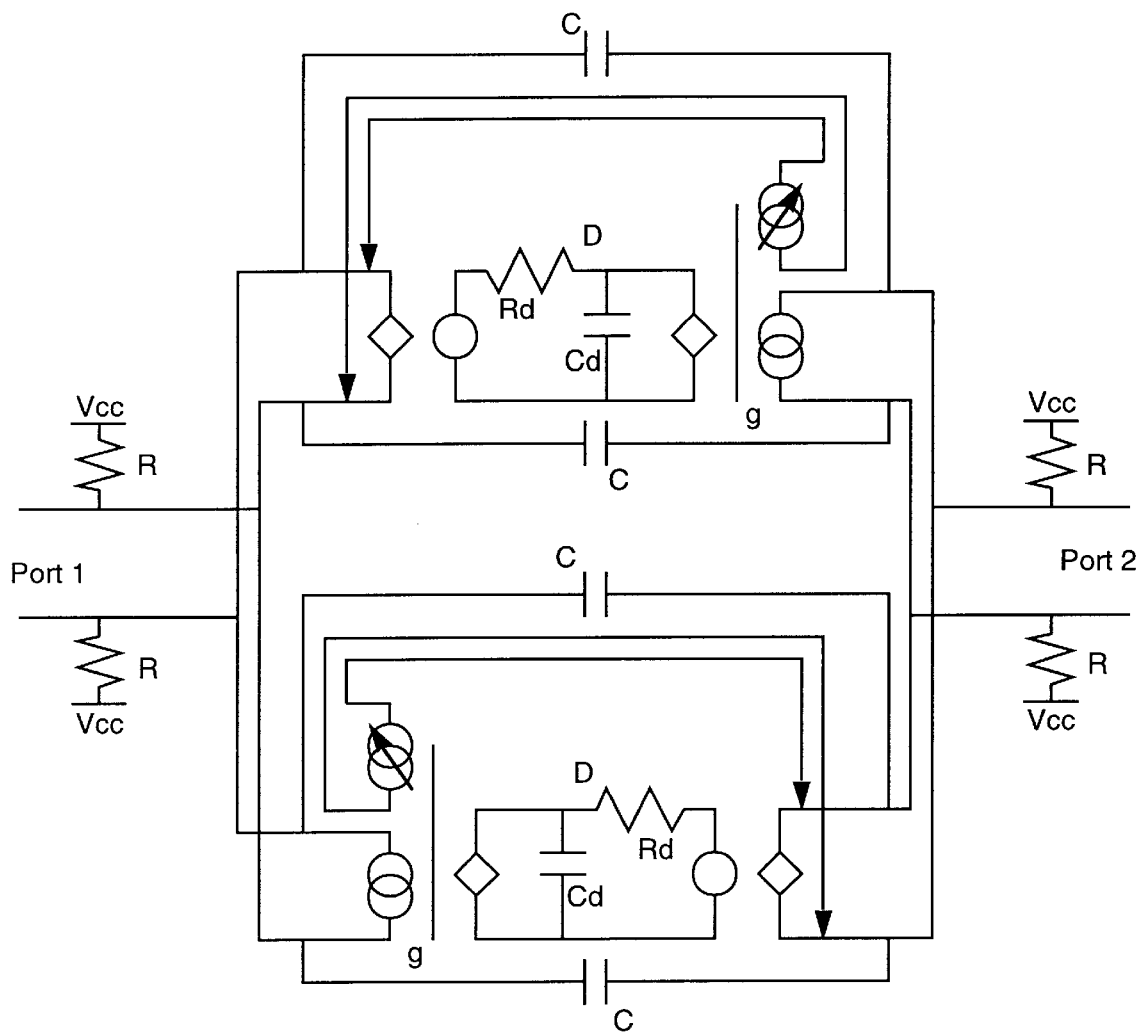
FIG. 3 illustrates a model of another prior art gyrator.

FIG. 2 shows a model of a prior art gyrator having shunt nodal capacitors. The gyrator has two ports—Port 1 and Port 2. Each port has two terminals and a shunt nodal capacitor C is connected between the two terminals which are connected to a terminal of supply voltage Vcc via load resistors R. FIG. 3 shows another prior art gyrator having Miller feedback nodal capacitors C, instead of shunt nodal capacitors. The principles of operation of these gyrators have been fully described in U.S. Pat. No. 5,371,475, which is incorporated herein by reference. Two semi-orthogonal conditions exist for the gyrator of FIG. 1 which are required for unity loop gain at which the gyrator will oscillate. Two possible topologies exist for the basic gyrator circuit as shown in FIGS. 2 and 3, for which identical unity gain conditions exist as:

$$\omega_0 = g/(C+GD) \tag{1}$$

$$D = G/(\omega_0^2 C) \tag{2}$$

Here, $\omega_0$ is a resonant angular frequency, g is a gyrator amplifier transconductance, G is a load loss admittance, D is an amplifier built in delay.

These gyrators are unique in the sense that they emulate a high Q parallel LRC resonant tank circuit with measured Q factors of 250, without employing a physical inductor. The inductor of the resonant circuit is obtained by transforming the capacitive reactance on one of the gyrator nodes so that it appears as an inductor in parallel with the capacitive reactance on the other node. While this feature is highly desirable in supplying a highly selective resonant circuit which suppresses the circuit noise, it is less effective in its ability to suppress unwanted noise from external sources. In this respect, the circuit is twice as sensitive to the effects of externally induced noise as compared to a conventional resonator with passive inductor. This is important because such high frequency noise can modulate the oscillator frequency and alias down into the frequency band of interest.

It will be apparent that the gyrator circuit would be improved if the capacitors could be replaced by inductors: thus one could notionally transform the inductive reactance at one node into a capacitive reactance at the other node and so form a resonant circuit. A mathematical treatment of this procedure, however, results in the requirement that the value of the inductors required for oscillation are finite and negative. Thus, this is not a practical solution.

With reference to FIG. 2, the capacitive admittance at either node (nodal admittance Y) is described as:

$$Y = G + j\omega C \quad (3)$$

The net loss admittance is capacitive. This is a necessary condition for the gyrator to oscillate, as the analysis for a purely inductive circuit shows.

II. Embodiment Gyrator

II-1. Gyrator Model

Figure 6:
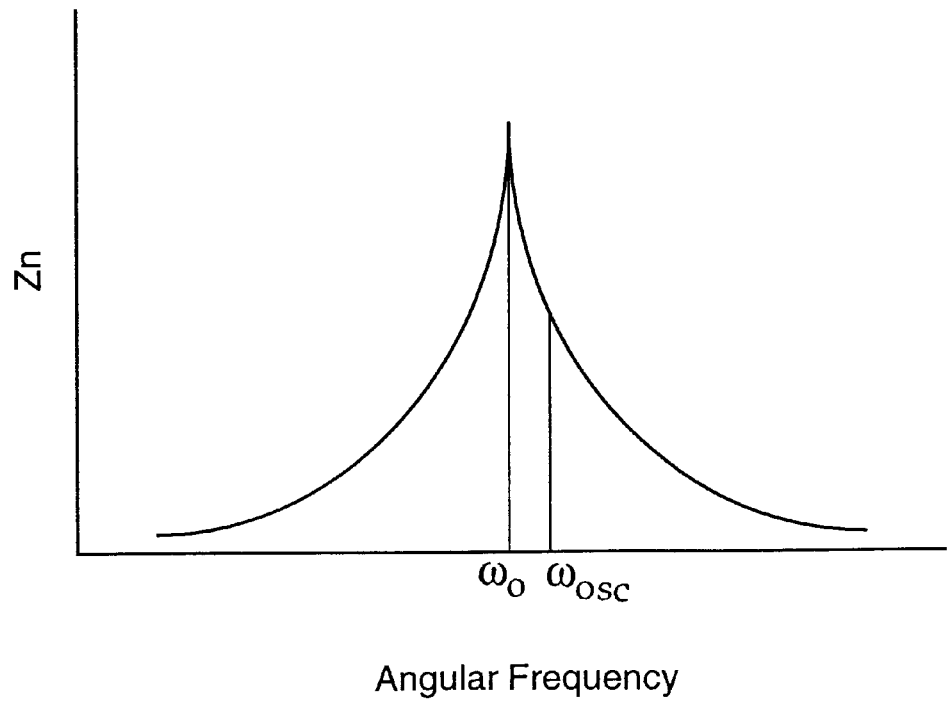
FIG. 6 is a graph of angular frequency—gyrator nodal impedance.
Figure 4:
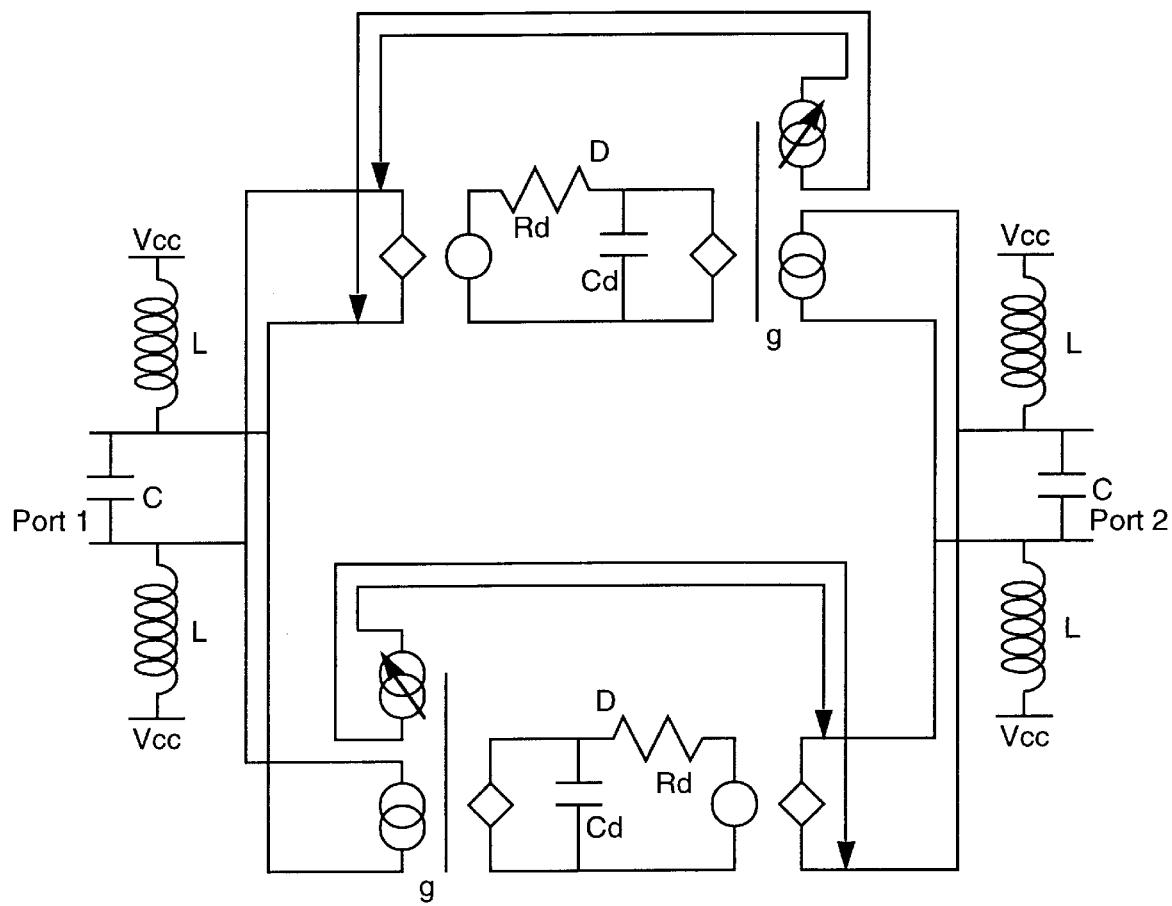
FIG. 4 illustrates a model of an embodiment of a gyrator according to the present invention.
Figure 5:
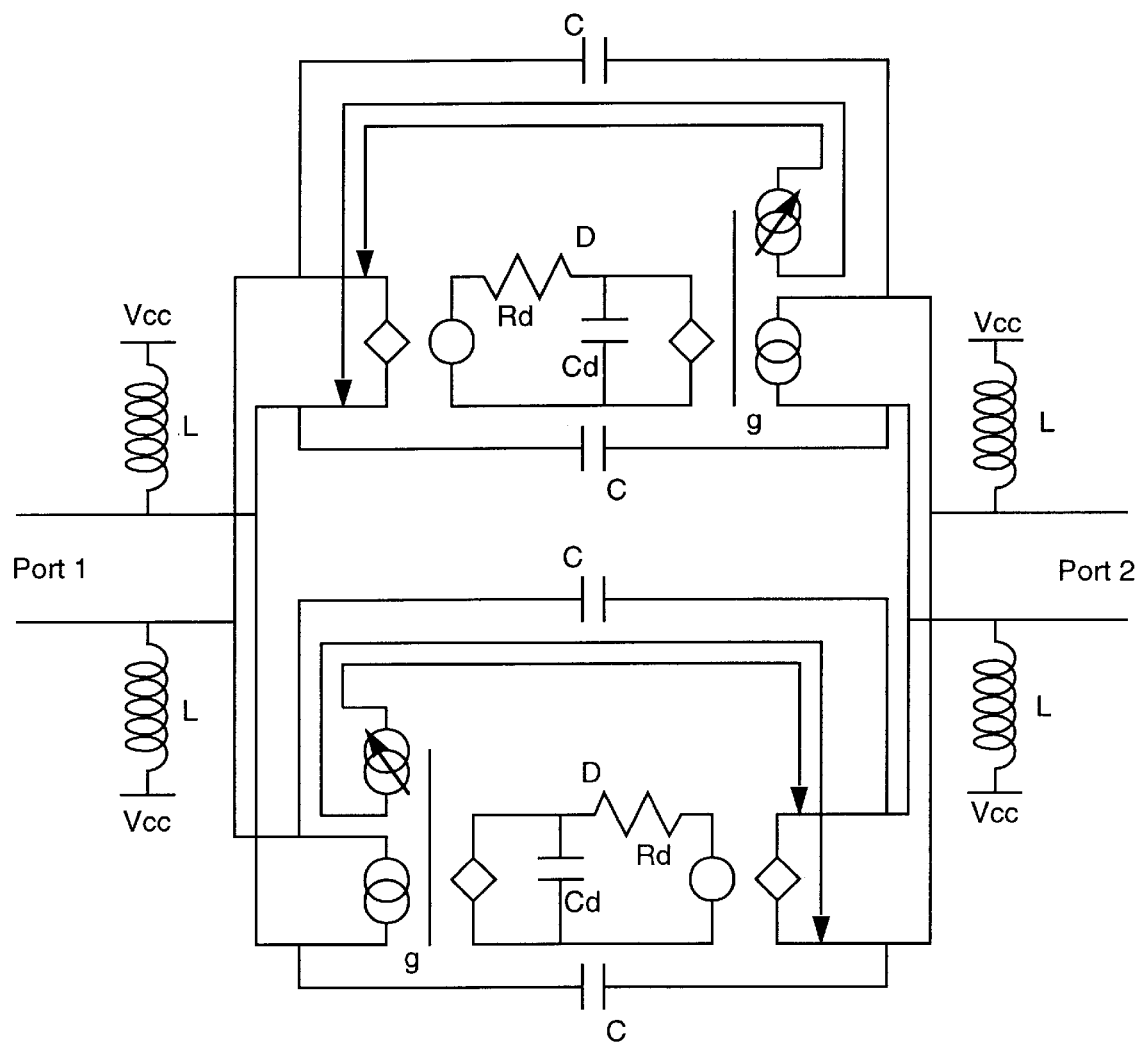
FIG. 5 illustrates a model of another embodiment of a gyrator according to the present invention.

FIG. 4 shows a model of an embodiment gyrator with shunt nodal capacitors and load inductors. In FIG. 4, the gyrator has two ports—Port 1 and Port 2, each port having two terminals. Each port is provided with a shunt nodal capacitor C between its terminals which are connected to a terminal of supply voltage Vcc via load inductors L. FIG. 5 shows a model of another embodiment gyrator having Miller feedback capacitors and load inductors. FIG. 6 illustrates a nodal impedance Zn as function of angular frequency $\omega$. The capacitive admittance at either port (nodal admittance Y) is described as:

$$Y = G + j\omega C + 1/j\omega L \quad (4)$$

$$Y = G + j(\omega C - 1/\omega L) \quad (5)$$

Note the admittance on the imaginary axis can be either capacitive or inductive depending upon the relative magnitude of the capacitance C and inductance L, and, most importantly, the magnitude of the angular frequency $\omega$. At the natural resonant frequency $\omega_0$ of the parallel C and L, their loss admittances are equal, so that the net loss admittance is G (resistive) and the circuit will not oscillate. At frequencies above the frequency $\omega_0$, the capacitive term dominates and the net admittance is capacitive. At this point it is essential to note that the presence of the inductance effectively reduces the capacitive admittance. Therefore, introduced is equivalent capacitance C' which determines new oscillating frequency $\omega_{osc}$ of the gyrator according to Equation 1 and Equation 2 such that:

$$C' = C - (1/\omega^2 L) \quad (6)$$

From Equation 6, it is possible to reduce the effective nodal capacitance Yn by partially cancelling it with the inductor, giving rise to the following desirable attributes:

(1) The oscillatory frequency of the gyrator can be raised higher than that attainable for the conventional gyrator of FIGS. 2 and 3 by introducing a parallel inductor to partially cancel the nodal capacitance as in FIG. 4.

(2) Alternatively a larger nodal capacitance can be employed at the same oscillator frequency by introducing a parallel inductor to partially cancel the nodal capacitance.

The ability to raise the oscillator frequency is very useful when the desired frequency is otherwise unattainable in a conventional gyrator due to parasitic capacitances.

The ability to increase the nodal capacitance is desirable when the gyrator nodal capacitance largely consists of non-linear parasitic capacitance which lowers the Q factor of the gyrator. By introducing a shunt linear capacitor and a shunt inductor, the net capacitance is more linear since the parasitics are largely swamped, while the same resonant frequency is attained.

In addition, the shunt load resistor used in the conventional gyrator appears in parallel with the added inductor and an equivalent Q factor can be calculated for the inductor resistor combination. Conveniently, the shunt resistor inductor combination can be replaced by a series combination of the inductor and a resistor having the same combined Q factor. The value of the series resistor is calculated to achieve the same Q factor as for the shunt inductor resistor combination. In practice, integrated inductors can be designed having the required Q factor without the requirement for an additional series resistor.

FIG. 6 shows the nodal impedance as a function of angular frequency, where $\omega_0$ is the resonant angular frequency and $\omega_{osc}$ is the oscillating angular frequency. The oscillating angular frequency $\omega_{osc}$ is shifted from the resonant angular frequency $\omega_o$ by C'.

Figure 7:
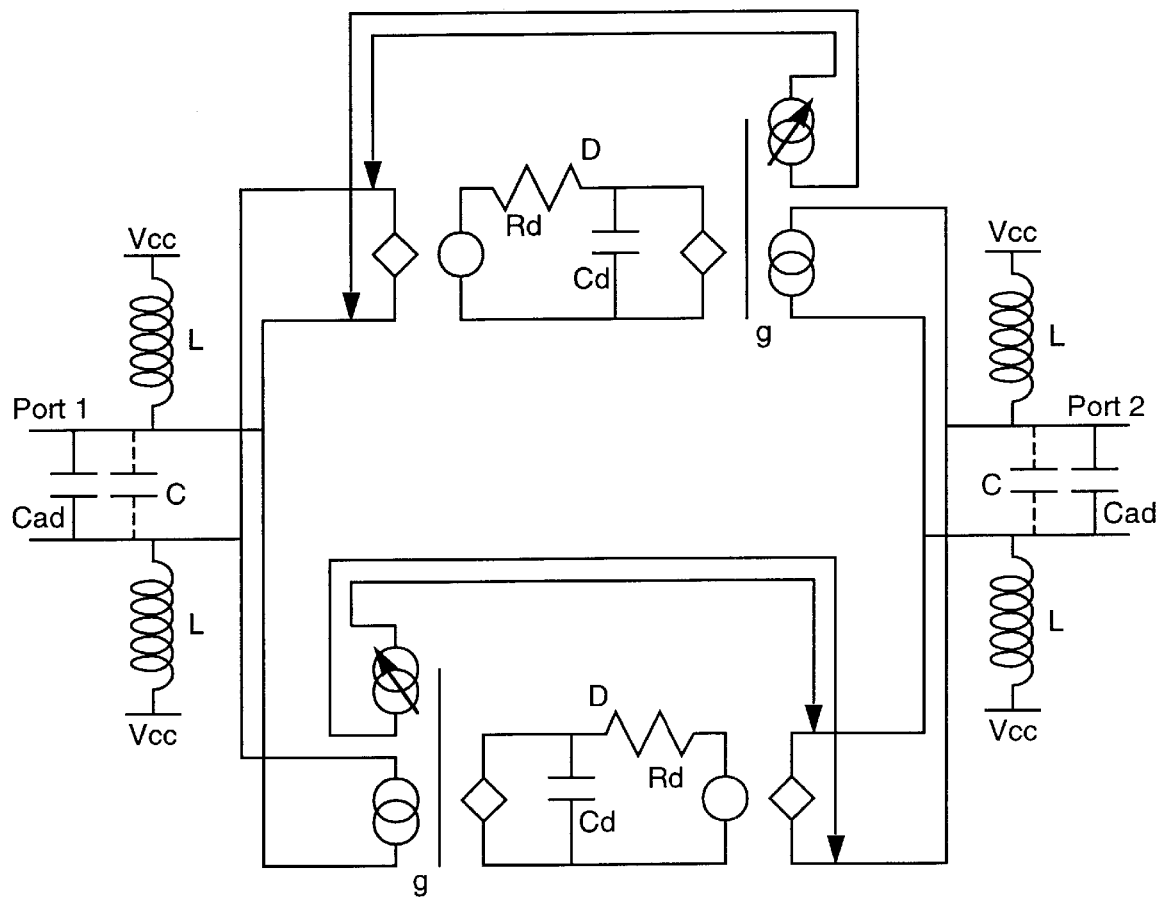
FIG. 7 illustrates a model of another embodiment of a gyrator according to the present invention.
Figure 8:
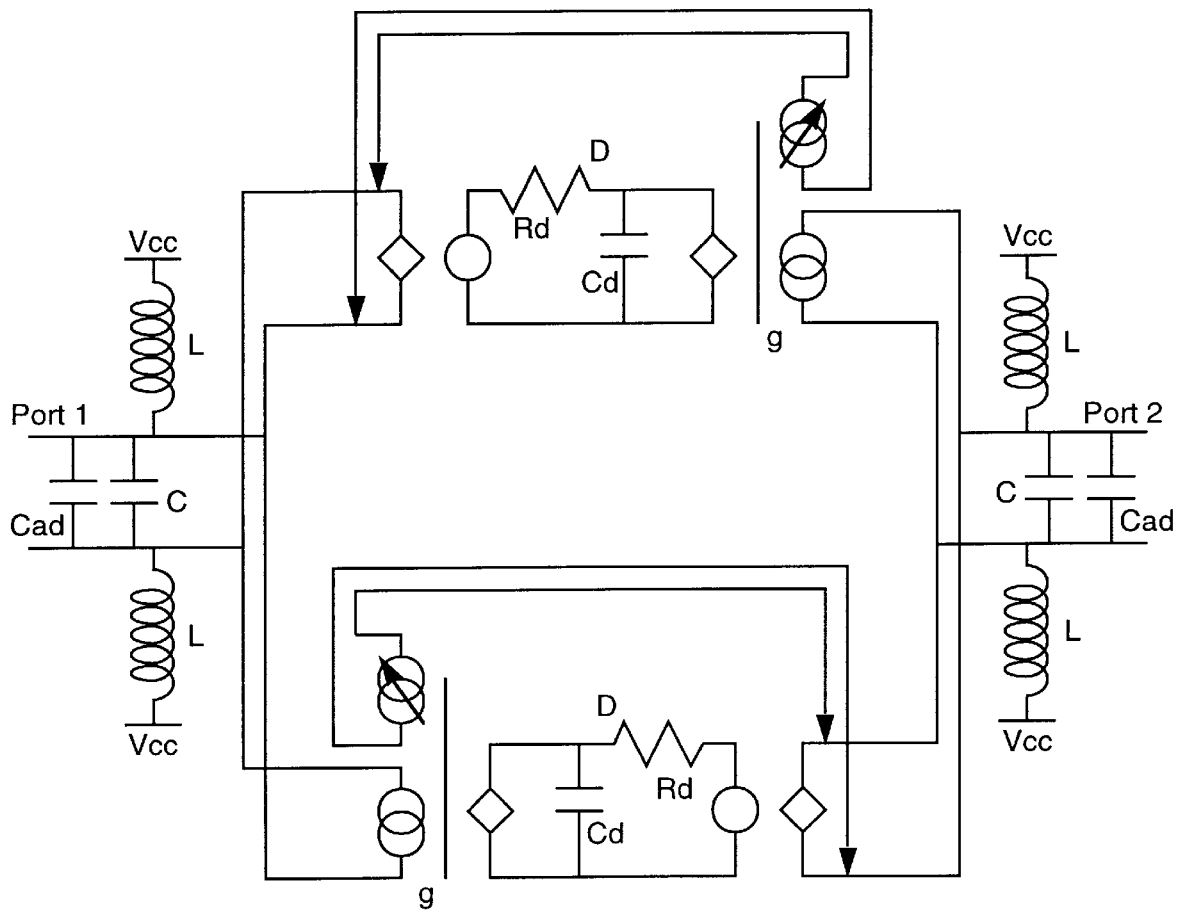
FIG. 8 illustrates a model of another embodiment of a gyrator according to the present invention.

FIG. 7 shows a model of an embodiment gyrator wherein nodal shunt capacitances are combination of parasitic capacitances C and additional capacitances Cad. The gyrator improves its linearity. FIG. 8 shows a model of an embodiment gyrator wherein nodal shunt capacitances are combination of capacitances C and additional capacitances Cad. The gyrator increases its oscillation frequency and improves its linearity.

Three examples will be given below for the comparison purpose.

EXAMPLE 1

Prior Art Gyrator of FIG. 2

Resonant Frequency=1 GHz

Nodal Capacitance C=1 pF

Shunt Load Resistance=350 Ω

Embodiment Gyrator of FIG. 4

Oscillation Frequency=2 GHz

Inductance L=8.4 nH (Inductor's Q factor=3.3)

Note that the parallel resonance frequency of the 1 pF capacitor and 8.4 nH inductor is 1.73 GHz and the equivalent capacitive reactance of the parallel combination at the 2 GHz oscillation frequency is 0.25 pF. In this example, the oscillating angular frequency $\omega_{osc}$ is shifted from the resonant angular frequency $\omega_o$ to a higher frequency (see FIG. 6).

EXAMPLE 2

Prior Art Gyrator

Resonant Frequency=1 GHz

Nodal Capacitance C=1 pF (consisting of non-linear circuit parasitics)

Shunt Load Resistance=350 Ω

Embodiment Gyrator (see FIG. 7)

Oscillation Frequency=1 GHz

Inductance L=12.7 nH (Inductor's Q factor 4.38)

Additional Shunt Capacitance Cad=2 pF

Note that the self resonant frequency of the parallel inductor capacitor combination is 0.816 GHz. The equivalent nodal capacitance is still 1 pF. In this example, the oscillating angular frequency $\omega_{osc}$ is substantially the same as the resonant angular frequency $\omega_o$.

EXAMPLE 3

Prior Art Gyrator

Resonant Frequency=1 GHz

Nodal Capacitance C=1 pF

Shunt Load Resistance=350 Ω

Embodiment (see FIG. 8)

Oscillation Frequency=2 GHz

Inductance L=3.6 nH (Inductor's Q factor=7.73)

Additional Shunt Capacitance Cad=1 pF

In this example, the gyrator oscillation frequency can be increased to a 2 GHz oscillation frequency while at the same time doubling the nodal capacitance linearity.

Thus, the ability to double the gyrator frequency while doubling the nodal capacitance can be achieved by replacing the shunt nodal load resistor with a shunt lossy inductor which at the same time achieves the purpose of discriminating against injected power supply noise. The filtering action of the inductor depends on the inductor capacitor combination and is enhanced where the nodal capacitance is increased. In the case of example 2, the attenuation of high frequency power supply noise increases at 12 dB per octave above 1 GHz as compared to the unmodified gyrator with 6 dB per octave. Thus, the improved gyrator has 43.6 dB attenuation of 10 GHz noise as compared to the unmodified gyrator with 27.2 dB.

A further advantage of replacing the resistive loads with lossy inductive loads is that the passive inductors can store energy, thus permitting voltage excursions above the supply rail. Also, of great advantage is the increased voltage swing possible with a given power supply since the dc voltage drop due to the 350 ω load resistor is no longer present.

II-2. Detailed Circuit of Embodiment Gyrator

Figure 9:
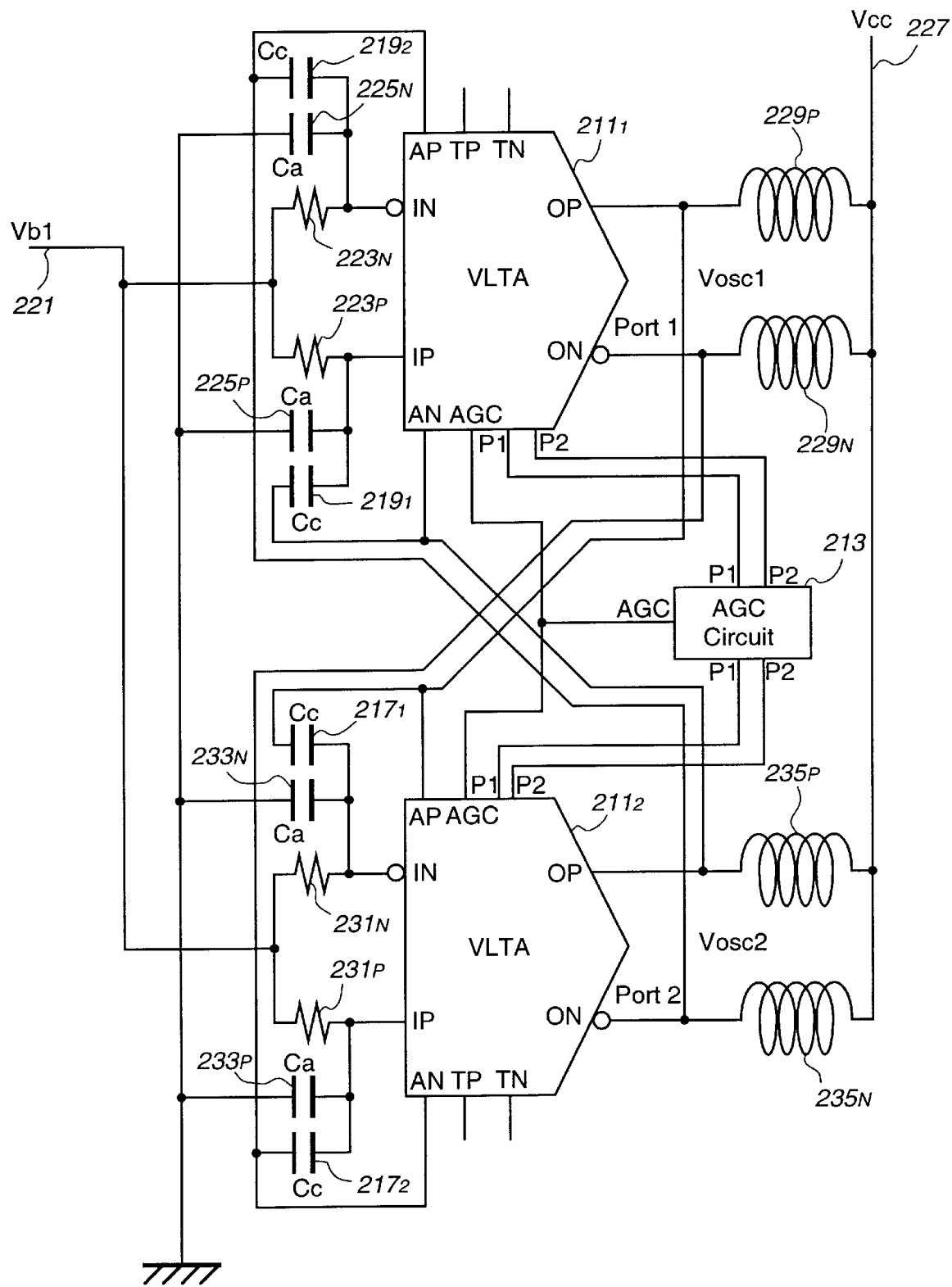
FIG. 9 is a schematic diagram of an embodiment of a gyrator according to the present invention.

Referring to FIG. 9 which shows a gyrator according to an embodiment of the present invention, the gyrator includes two variable linear transconductance amplifiers (VLTAs) $211_1$ and $211_2$ having the same circuit configuration and an automatic gain control (AGC) circuit 213. Each of the VLTAs $211_1$ and $211_2$ has inverting and non-inverting inputs IN and IP and inverting and non-inverting outputs ON and OP. Each VLTA provides differential output voltage between its non-inverting and inverting outputs OP and ON in response to differential input voltage fed between its non-inverting and inverting inputs IP and IN. The outputs OP and ON of the VLTA $211_1$ are connected to the inputs IN and IP of the VLTA $211_2$ via capacitors $217_1$ and $217_2$, respectively. The outputs OP and ON of the VLTA $211_2$ are connected to the inputs IP and IN of the VLTA $211_1$ via capacitors $219_1$ and $219_2$, respectively. Each of the capacitors $217_1$, $217_2$, $219_1$ and $219_2$ has capacitance Cc. The inputs IP and IN of the VLTA $211_1$ are connected to a bias terminal 221 to which bias voltage Vb1 is fed, via resistors 223P and 223N, respectively. The inputs IP and IN of the VLTA $211_1$ are connected to the ground terminal via capacitors 225P and 225N, respectively. The outputs OP and ON of the VLTA $211_1$ are connected to a terminal 227 of supply voltage Vcc (e.g., +5 V), via inductors 229P and 229N, respectively. The inputs IP and IN of the VLTA $211_2$ are connected to the bias terminal 221 via resistors 231P and 231N, respectively. The outputs OP and ON of the VLTA $211_1$ are connected to other inputs AP and AN of the VLTA$_2$, respectively. The outputs OP and ON of the VLTA $211_2$ are connected to other inputs AN and AP of the VLTA$_1$, respectively. The inputs IP and IN of the VLTA $211_2$ are connected to the ground terminal via capacitors 233P and 233N, respectively. Each of the capacitors 225N, 225P, 233N and 233P has capacitance Ca. The outputs OP and ON of the VLTA $211_2$ are connected to the terminal 227 via inductors 235P and 235N, respectively. Peak detection terminals P1 and P2 of the VLTAs $211_1$ and $211_2$ are connected to the respective peak detection terminals P1 and P2 of the AGC circuit 213, the AGC terminal of which is connected to AGC terminals of VLTAs $211_1$ and $211_2$.

The outputs OP and ON of the VLTA $211_1$ are defined as "Port 1" and the outputs OP and ON of the VLTA $211_2$ are defined as "Port 2". The nodal capacitance of the each port is a series of the two capacitances Cc and the two capacitances Ca. The VLTAs $211_1$ and $211_2$ are biased through the resistors 223N, 223P and 231N, 231P by the bias voltage Vb1. The VLTAs $211_1$ and $211_2$ develop large voltage swings in the inductors 229P, 229N, 235P and 235N. The gain of the VLTA $211_1$ is the same one as that of the VLTA $211_2$. A total gain of a loop comprising the VLTAs $211_1$ and $211_2$ is greater than unity. Each of the VLTAs $211_1$ and $211_2$ has a 90 degree phase shift between its input and output at a resonant frequency. Quadrature output voltage Vosc1 and Vosc2 are provided from Ports 1 and 2, respectively. The capacitors 225N, 225P, 233N and 233P of the capacitance Cc attenuate the signals at the inputs of the VLTAs $211_1$ and $211_2$, so as to avoid overloading the VLTAs.

Figure 10:
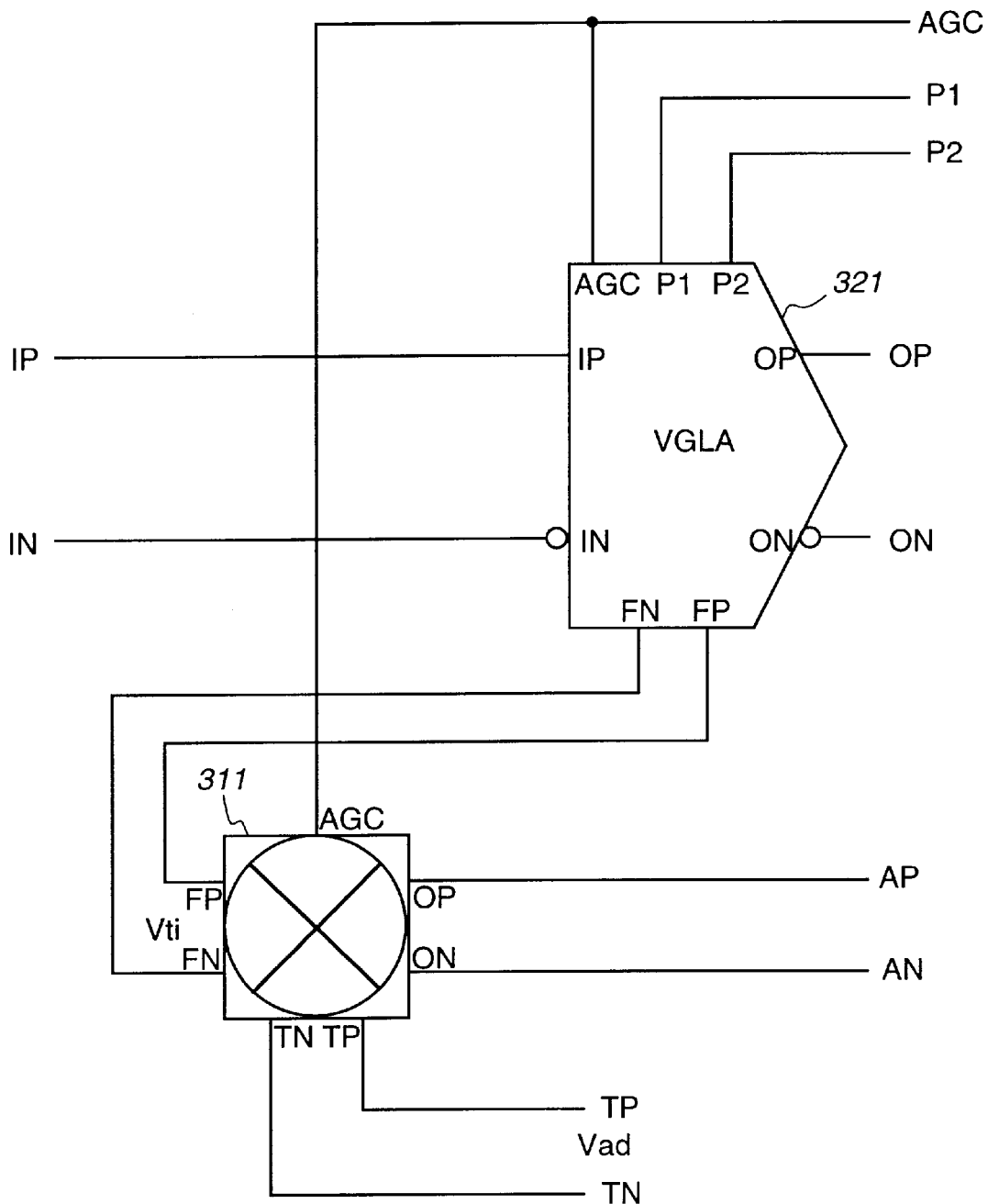
FIG. 10 is a block diagram of a variable linear transconductance amplifier used in the gyrator shown in FIG. 9.

FIG. 10 shows the VLTA which includes a tuner 311 and a variable gain linear amplifier (VGLA) 321. The non-inverting and inverting inputs IP and IN of the VLTA are connected to non-inverting and inverting inputs IP and IN of the VGLA 321, respectively, the non-inverting and inverting outputs OP and ON of which are connected to the non-inverting and inverting outputs OP and ON of the VLTA. Tuning terminals FP and FN of the VGLA 321 are connected to the tuning terminals FP and FN of the tuner 311, the tuning inputs TP and TN are connected to the tuning inputs of the VLTA. The inputs AP and AN of the VLTA are connected to the outputs OP and ON of the tuner 11. The AGC terminals of the tuner 311 and VGLA 321 are connected to the AGC terminal of the VLTA to which AGC voltage Vagc is fed. The tuning inputs TP and TN are provided with differential tuning adjustable voltage Vad (the source of which is not shown). Differential tuning input voltage Vti is fed from the tuning terminals FP and FN of the VGLA 321 to the tuning terminals FP and FN of the tuner 311.

The tuner 311 and the VGLA 321 are combined to create a linear tuning arrangement. This technique is based on the vector summation of the amplifier output current with a variable quadrature feedback signal, so as to alter the transconductor amplifier delay and hence the gyrator frequency.

Figure 11:
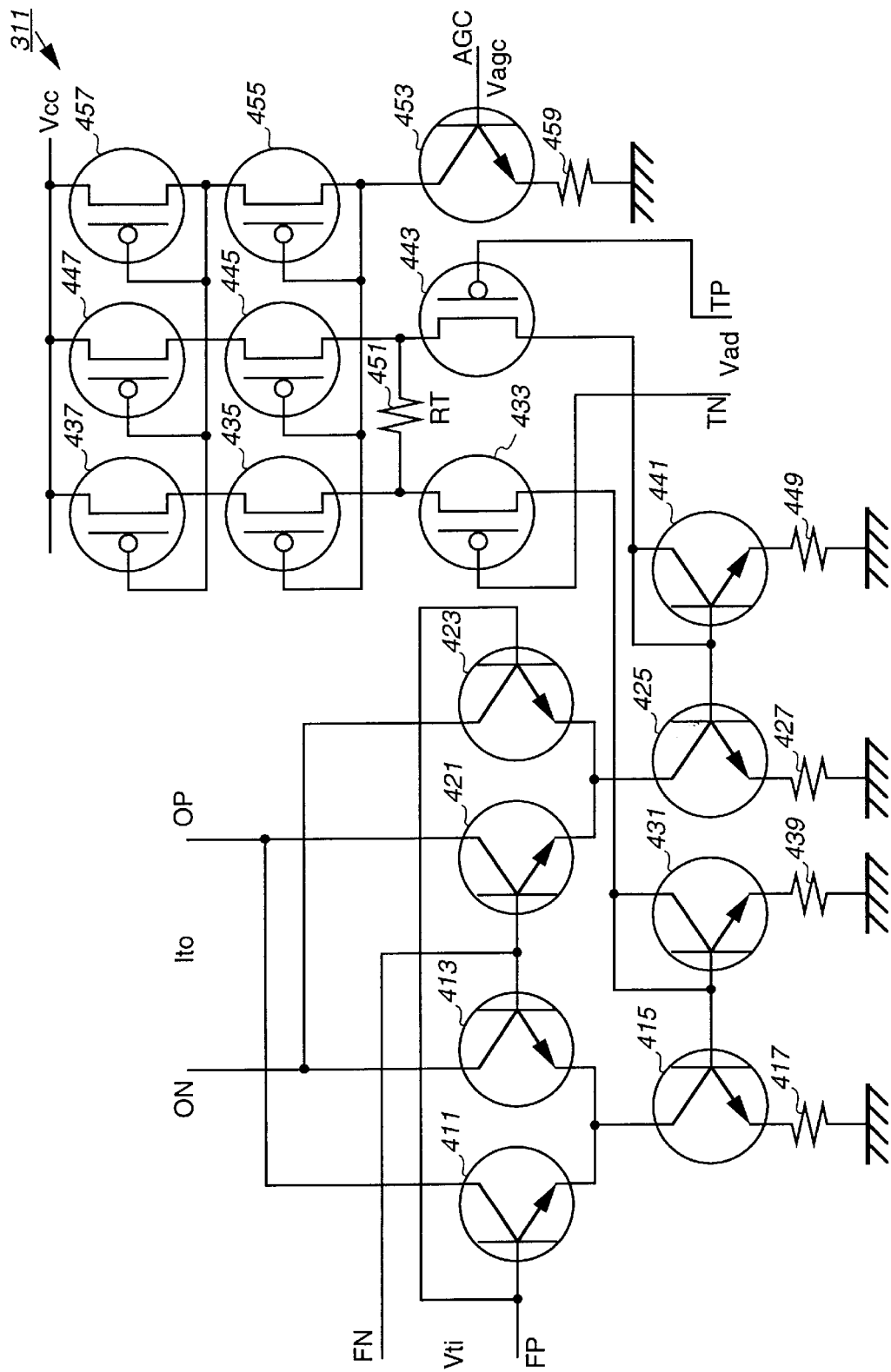
FIG. 11 is a schematic diagram of a tuning circuit used in the transconductance amplifier shown in FIG. 10.

FIG. 11 shows the tuner 311 of FIG. 10. The following description assumes, for simplicity and purely by way of example, that the FETs referred to are P-channel MOSFETs (metal oxide semiconductor field effect transistors) and the transistors referred to are N-type bipolar transistors. In FIG. 11, the tuner 311 includes two differential amplifier circuits of transistors 411, 413, 415 and a resistor 417 and transistors 421, 423, 425 and a resistor 427. The tuning terminals FP and FN are connected to the bases of the transistors 411, 423 and the bases of the transistors 413, 421, respectively. The non-inverting and inverting outputs OP and ON of the tuner 311 are connected to the collectors of the transistors 411, 421 and the collectors of the transistors 413, 423, respectively. The base of the transistor 415 is connected to the base of a transistor 431, the base and collector of which are connected to series-connected FETs 433, 435 and 437. The emitter of the transistor 431 is connected to the ground terminal via a resistor 439. Similarly, the base of the transistor 425 is connected to the base of a transistor 441, the base and collector of which are connected to series-connected FETs 443, 445 and 447. The emitter of the transistor 441 is connected to the ground terminal via a resistor 449. The tuning inputs TP and TN are connected to the gates of the FETs 443 and 433, respectively. A resistor 451 of resistance RT is connected between the sources of the FETs 433 and 443. The AGC terminal is connected to the base of a transistor 453, the collector of which is connected to series-connected FETs 455 and 457. The emitter of the transistor 453 is connected to the ground terminal via a resistor 459. The sources of the FETs 437, 447 and 457 are connected to a terminal of dc supply voltage Vcc (e.g., +5 volts). The differential tuning adjustable voltage Vad is fed to the gates of the FETs 443 and 433. The differential tuning input voltage Vti is fed to the bases of the transistors 411 and 413 from the collectors of which the differential tuning output current Ito is provided.

The tuner 311 is essentially a four quadrant mixer which multiplies the differential tuning input voltage Vti with the differential tuning adjustable voltage Vad, so as to produce the differential tuning output current Ito having a variable amplitude. The base of the transistor 453 is provided with the AGC voltage Vagc which is also fed to the VGLA 321.

Figure 12:
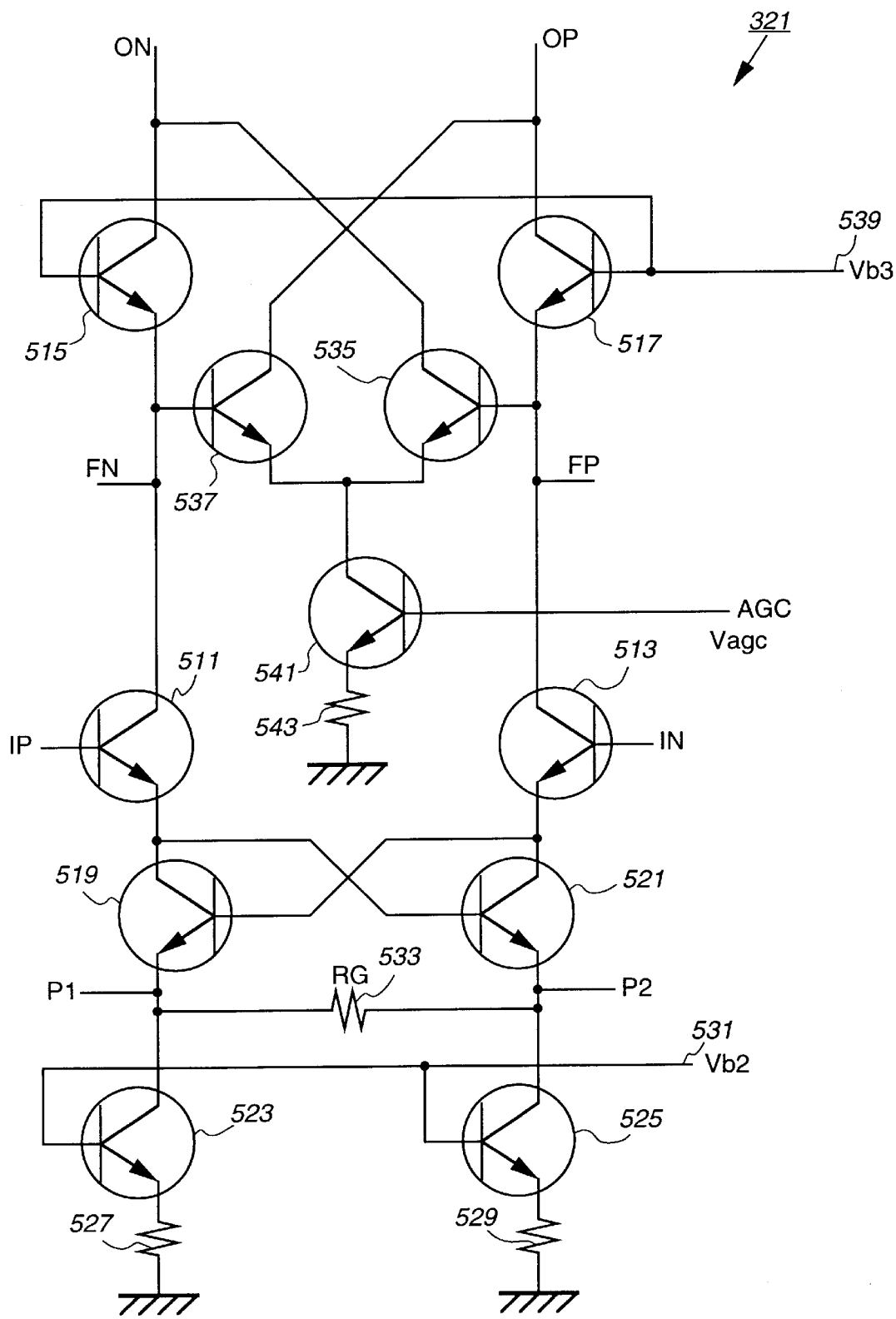
FIG. 12 is a schematic diagram of a variable gain linear transconductance amplifier used in the transconductance amplifier shown in FIG. 10.

FIG. 12 shows the VGLA 321 of FIG. 10. In FIG. 12, the non-inverting and inverting inputs IP and IN of the VGLA 321 are connected to the bases of transistors 511 and 513, the collectors of which are connected to the emitters of transistors 515 and 517, respectively. The emitter of the transistor 511 is connected to the collector of a transistor 519 and the base of a transistor 521. The emitter of the transistor 513 is connected to the collector of the transistor 521 and the base of the transistor 519. The emitters of the transistors 519 and 521 are connected to the collectors of transistors 523 and 525, respectively, the emitters of which are connected to the ground terminal via resistors 527 and 529, respectively. The bases of the transistors 523 and 525 are connected to a bias terminal 531 to which bias voltage Vb2 is fed. A gain control resistor 533 of resistance RG is connected between the emitters of the transistors 519 and 521. The collectors of the transistors 515 and 517 are connected to the inverting and non-inverting outputs ON and OP of the VGLA 321, respectively, and to the collectors of transistors 535 and 537, respectively. The bases of the transistors 515 and 517 are connected to a bias terminal 539 to which bias voltage Vb3 is fed. The emitters of the transistors 535 and 537 are connected to the collector of a transistor 541, the emitter of which is connected to the ground terminal via a resistor 543. The base of the transistor 541 is connected to the AGC terminal. Each of the voltages Vb2 and Vb3 is fed by a constant voltage source (not shown).

The VGLA 321 is a differential amplifier. The transistors 523 and 525 with the emitter degeneration resistors 527 and 529 operate as current sources. The transistors 515, 517, 535 and 537 operate on the translinear principle. The impedance seen at the emitters of the transistors 515 and 517 is very low, typically a few ohms, since it is the reciprocal of the transconductance of these transistors plus some parasitic resistance. The transconductance of this complete amplifier can be controlled by varying the current sourced into the AGC input.

The transistors 519 and 521 are added in order to make the input amplifier linear. The non-linear characteristic of the positive feedback pair 519 and 521 is the exact opposite of the non-linear characteristic of transistors 511 and 513, thus creating a highly linear amplifier out of transistors 511, 513, 519 and 521. The combination of this linear input amplifier and the linear output amplifier results in that the circuit of FIG. 12 is a highly linear high speed variable gain transconductance amplifier. Voltage across the resistor 533 is used by the AGC circuit for peak detection. The voltage (i.e., the differential tuning input voltage Vti) between the tuning terminals FP and FN is used for tuning control.

Figure 13:
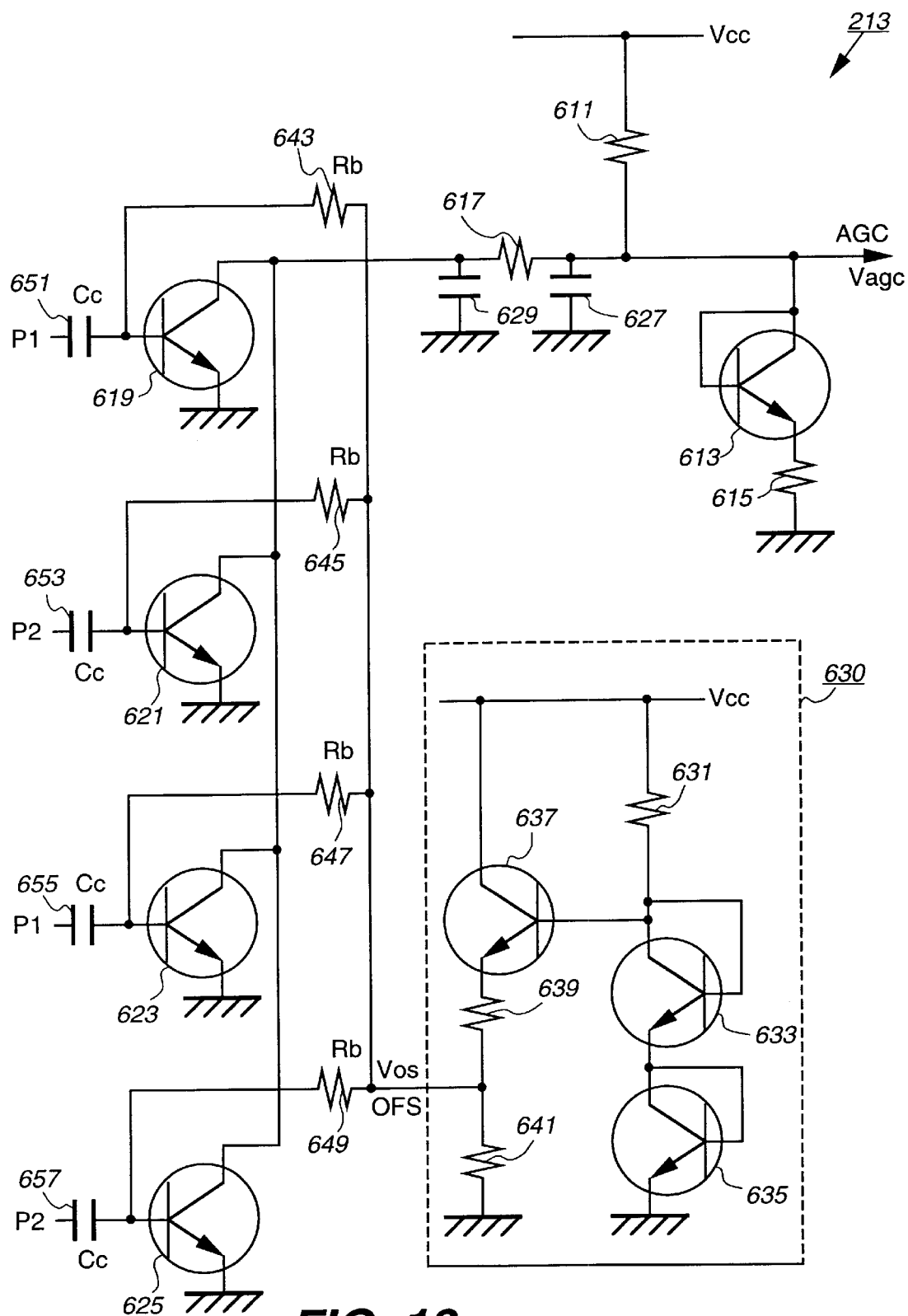
FIG. 13 is a schematic diagram of an automatic gain control circuit used in the transconductance amplifier shown in FIG. 9.

FIG. 13 shows an AGC circuit 213 of FIG. 9. In FIG. 13, a resistor 611, a diode-connected transistor 613 and a resistor 615 are connected in series between a terminal of the supply voltage Vcc and the ground terminal. The AGC terminal is connected to the collector of the transistor 613 and via a resistor 617 to the collectors of transistors 619, 621, 623 and 625, the emitters of which are connected to the ground terminal. The both terminals of the resistor 617 are connected to the ground terminal via capacitors 627 and 629.

The AGC circuit 213 includes an offset circuit 630 wherein a resistor 631 and two diode-connected transistors 633 and 635 are connected in series between the Vcc terminal and the ground terminal. The collector of the transistor 633 is connected to the base of a transistor 637, the emitter of which is connected to the ground terminal via series-connected resistors 639 and 641. The collector of the transistor 637 is connected to the Vcc terminal. The junction of the resistors 639 and 641 is connected to an output OFS of the offset circuit 630.

The output OFS is connected to the bases of the transistors 619, 621, 623 and 625 via resistors 643, 645, 647 and 649, respectively. Each of the resistors 643, 645, 647 and 649 has resistance Rb. The bases of the transistors 619 and 621 are connected to the peak detection terminals P1 and P2 of the VGLA 321 of the VLTAs $211_1$ via capacitors 651 and 653, respectively. Similarly, the bases of the transistors 623 and 625 are connected to the peak detection terminals P1 and P2 of the VGLA 321 of the other VLTAs $211_2$ via capacitors 655 and 657, respectively.

The circuit 213 is a typical AGC arrangement to keep the VLTAs $211_1$ and $211_2$ operating in the linear region. Under start-up conditions, the resistor 611 supplies current from the supply voltage Vcc to the transistor 613. This establishes the bias AGC voltage Vagc which is fed to the transistor 453 of the tuner 311 and the transistor 541 of the VGLA 321. Once the oscillator signal reaches the required amplitude, the remaining circuit of the AGC circuit 213 reduces the AGC bias voltage as described below.

The transistors 619, 621, 623 and 625 operate as peak detectors. The resistors 643, 645, 647 and 649 permit a bias voltage to be presented to the transistors 619, 621, 623 and 625, so as to bias these transistors off by a predetermined offset voltage Vos derived from the offset circuit 630. If the emitter current density in the transistors 633, 635 and 637 is the same, then the offset voltage Vos will be given by:

$$Vos = Vbe \times Rdiv$$

Where Vbe is the base-emitter voltage of the transistors. Rdiv is a voltage division ratio which is given by:

$$Rdiv = R_{641}/(R_{639}+R_{641})$$

Where $R_{639}$ and $R_{641}$ are the resistances of the resistors 639 and 641, respectively. The offset voltage Vos has a negative temperature coefficient which is the same as that of a semiconductor diode: i.e., approximately $-0.002 \times Rdiv$ v/C°. In order to cancel the negative temperature coefficient, and maintain a constant oscillator output voltage level, it is necessary to increase the emitter current density of the transistor 637 relative to that of the transistors 633 and 635. This will create an additional offset voltage at the output OFS of the offset circuit 630 with a positive temperature coefficient. This is an application of the band gap principle used in band gap voltage generators. Finally one also has to take into account the ratio of the peak emitter current density in the transistors 619, 621, 623 and 625 relative to the transistor 635, and typically this would be made unity to avoid any additional temperature effects in the oscillator output level. It has been assumed in this description that the temperature coefficient of the resistance of the resistor 631 is zero. If this is not true, its effect can be cancelled by modifying the emitter current density ratio in the transistors 637 and 633 in conjunction with the ratio Rdiv.

In a typical arrangement, a 5.9 GHz oscillator with 5 Vp-p differential quadrature outputs can be obtained with this oscillator. The supply voltage must be at least 5 V relative to ground potential. Values of the capacitors in FIG. 9 are as follows:

$$Cc = 0.5 \text{ pF}$$

$$Ca = 1.5 \text{ pF}$$

The capacitor attenuator is thus 3:1 and a 2.5 volts single ended swing at the output creates a 0.83 volt single ended swing at the input For the differential amplifier to operate in its linear range, the value of the resistor RG multiplied by the current sunk in transistors 523, 525 must exceed 2 volts. This is controlled by the bias voltage Vb2. In this design, RG is 1 kΩ and the current sink is 2 mA. The AGC limited the output to 2.6 Vp-p, or 5.2 V differential peak-peak. The value of the inductors is 2 nH with a Q factor of 6.4 at 5.9 GHz. The resistances of the bias resistors 527, 529 and 543 are 10 kΩ and the bias voltage Vb1 is 2.2 V. The bias voltage Vb3 is 3 V.

Particular advantages of this embodiment are:

use of a capacitor divider circuit avoids delay in the coupled signal so as to obtain maximum oscillator frequency and the capacitors perform a dual function as the gyrator capacitors. In addition the capacitors increase the efficiency of the VCO over that using a resistor attenuator;

the large signal swing output increases the carrier to noise ratio and so reduces the phase noise;

the inductors inductance and quality factor were chosen for ease of practical implementation at the oscillator frequency. Also since the function of the inductor is to partially cancel the gyrator capacitance, relatively large capacitors are used which swamp the non-linearities due to the transistor parasitic capacitance.

Due to the low impedance presented by the shunt capacitors Ca at the input of the amplifiers, and the relatively large input signal, the noise performance of the amplifiers is good.

VII. Another Embodiment

Figure 14:
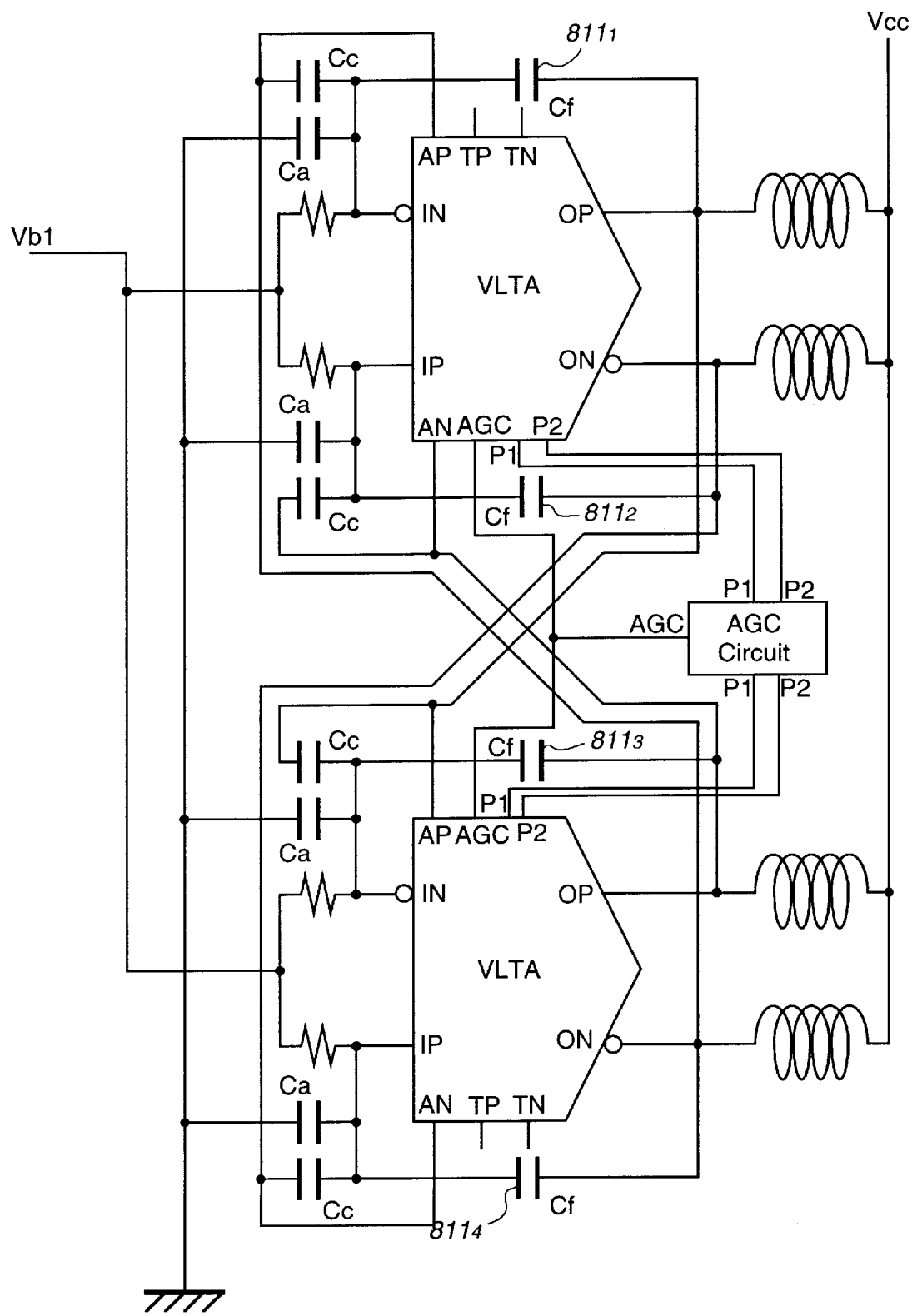
FIG. 14 is schematic diagram of another embodiment of a gyrator according to the present invention.

FIG. 14 shows another embodiment including Miller feedback capacitors $811_1$, $811_2$, $811_3$ and $811_4$ which are connected between the respective non-inverting or inverting output and the inverting or non-inverting input of the VLTAs. The capacitors $811_1$, $811_2$, $811_3$ and $811_4$ are employed to further linearize the gyrator.

Although particular embodiments of the present invention have been described in detail, it should be appreciated that numerous variations, modifications, and adaptations may be made without departing from the scope of the present invention as defined in the claims. For example, the channel types of the FETs and the types of the bipolar transistors may inverse.

What is claimed is:

1. A gyrator comprising:

a loop having two ports, each port having two terminals, the loop comprising loop-connected first and second amplifiers, each of the first and second amplifiers having a transconductance delay built therein, the gain of the loop being greater than unity, a nodal capacitance appearing between two port's terminals, the capacitance transforming into a nodal inductance in the alternate port, the capacitance and inductance forming a resonant circuit for the gyrator oscillation, the nodal capacitance being a factor to the resonant frequency of the gyrator; and a plurality of inductive elements, each inductive element being coupled to the respective terminal of the two ports, thereby decreasing the nodal capacitance, so that the gyrator oscillates at a frequency which is higher than a natural resonant frequency obtained from the combination of the plurality of inductive elements and the nodal capacitance.

2. The gyrator of claim 1, wherein the nodal capacitance appears between the two terminals of each port.

3. The gyrator of claim 1, wherein the nodal capacitance appears between one terminal of one port and one terminal of the other port.

4. The gyrator of claim 1, wherein:

first and second amplifiers of the loop comprise first and second transconductance amplifiers, respectively, each transconductance amplifier having inverting and non-inverting inputs and outputs, the loop comprises amplifier coupling means for coupling the inverting and non-inverting outputs of the first transconductance amplifier to the non-inverting and inverting inputs of the second transconductance amplifier, respectively, and for coupling the inverting and non-inverting outputs of the second transconductance amplifier to the inverting and non-inverting inputs of the first transconductance amplifier, respectively, the gain of the loop comprising the first and second transconductance amplifiers being greater than unity, wherein each of the first and second transconductance amplifiers has a generally 90 degree phase shift between its input and output at the resonant frequency.

5. The gyrator of claim 4, wherein the amplifier coupling means comprises capacitive-coupling means for capacitively coupling the outputs of the transconductance amplifiers to their inputs.

6. The gyrator of claim 5, wherein the capacitive-coupling means comprises four capacitance elements, each coupling one of the outputs of the transconductance amplifiers to the respective input.

7. The gyrator of claim 4, wherein each of the first and second transconductance amplifiers comprises a variable transconductance amplifier.

8. The gyrator of claim 7, further comprising gain control means for causing the variable transconductance amplifier to operate as a variable linear transconductance amplifier.

9. The gyrator of claim 8, wherein the variable transconductance amplifier comprises variable gain amplifier means, the gain of which is linearly controlled by the gain control means.

10. The gyrator of claim 9, wherein the variable gain amplifier means comprises:

first and second current sources;

a differential pair of first and second transistors, the bases of which are coupled to the non-inverting and inverting inputs of the transconductance amplifier;

a compensation pair of third and fourth transistors, the collector, base and emitter of the third transistor being connected to the emitter of the first transistor, the emitter of the second transistor and the first current source, respectively, the collector, base and emitter of the fourth transistor being connected to the emitter of the second transistor, the emitter of the first transistor and the second current source, respectively;

a resistance element connected between the emitters of the third and fourth transistors;

an active resistance pair of fifth and sixth transistors, the emitters of the fifth and sixth transistors being connected to the collectors of the first and second transistors, the collectors of the fifth and sixth transistors being connected to the inverting and non-inverting outputs of the transconductance amplifier;

a gain control pair of seventh and eighth transistors, the collectors of which are connected to the collectors of the sixth and fifth transistors, respectively, the bases of the seventh and eighth transistors being connected to the emitters of the fifth and sixth transistors, respectively; and a ninth transistor, the collector of which is connected to the emitters of the seventh and eighth transistors, so that the gain of the variable transconductance amplifier is controlled in response to a gain control voltage fed to the base of the ninth transistor.

11. The gyrator of claim 10, wherein the gain control means comprises detection means for producing the gain control voltage in response to the differential signals fed from the variable transconductance amplifiers, each differential signal being caused across the resistance element.

12. The gyrator of claim 11, wherein the detection means comprises means for detecting the peak of the differential signal to produce the gain control voltage which automatically controls the gain of the first and second transconductance amplifiers.

13. The gyrator of claim 11, wherein the variable transconductance amplifier further comprises tuning means for tuning with differential voltage between the collectors of the first and second transistors.

14. The gyrator of claim 13, wherein the tuning means comprises two differential amplifiers, each comprising a pair of transistors and a current source, the two differential amplifiers being coupled, so as to produce quadrant signals, the gain of the differential amplifiers being varied in response to the gain control voltage.

15. The gyrator of claim 14, wherein the tuning means further comprises means for varying the gain of the tuning means in response to the gain control voltage.

16. The gyrator of claim 11, wherein the detection means comprises transistor means for detecting the peak signal and bias means for feeding bias voltage to the transistor means.

17. The gyrator of claim 16, wherein the bias means comprises voltage means for producing the bias voltage which is temperature-compensated in the transistor means.

18. The gyrator of claim 17, wherein the voltage means comprises transistors, the temperature-varying coefficients match that of the transistor means.

* * * * *